United States Patent
Cho

(10) Patent No.: US 8,159,477 B2
(45) Date of Patent: Apr. 17, 2012

(54) APPARATUS FOR SHIELDING ELECTROMAGNETIC INTERFERENCE OF DISPLAY MODULE AND A MANUFACTURING METHOD THEREOF

(75) Inventor: Young-min Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1154 days.

(21) Appl. No.: 11/524,302

(22) Filed: Sep. 21, 2006

(65) Prior Publication Data

US 2007/0171622 A1 Jul. 26, 2007

(30) Foreign Application Priority Data

Jan. 20, 2006 (KR) ........................ 10-2006-0006211

(51) Int. Cl.
*G09G 5/00* (2006.01)
*H05K 9/00* (2006.01)

(52) U.S. Cl. ........ 345/204; 345/679; 361/816; 361/817; 361/818

(58) Field of Classification Search ............... 345/204, 345/173, 679, 87, 93; 313/582, 587, 512, 313/478, 580, 112, 489; 315/169.3, 169.4, 315/248, 278, 291; 361/679.2, 829, 728, 361/679.09, 704, 707, 714, 816–818, 725; 349/64, 40, 65, 59, 58, 150, 149, 67, 139; 211/189

See application file for complete search history.

(56) References Cited

U.S. PATENT DOCUMENTS

| | | | | | |
|---|---|---|---|---|---|
| 2,508,896 | A | * | 5/1950 | Smith | 200/37 R |
| 4,519,664 | A | * | 5/1985 | Tillotson | 439/607.03 |
| 4,779,025 | A | * | 10/1988 | Paynton et al. | 313/478 |
| 4,785,136 | A | * | 11/1988 | Mollet et al. | 174/363 |
| 4,839,736 | A | * | 6/1989 | Sugihara et al. | 348/835 |
| 4,964,018 | A | * | 10/1990 | Mallory et al. | 361/725 |
| 5,612,733 | A | * | 3/1997 | Flohr | 348/14.16 |
| 5,696,669 | A | * | 12/1997 | Bassler et al. | 361/816 |
| 5,748,269 | A | * | 5/1998 | Harris et al. | 349/58 |
| 5,834,693 | A | * | 11/1998 | Waddell et al. | 174/657 |
| 5,902,026 | A | * | 5/1999 | Swan et al. | 312/138.1 |
| 6,191,938 | B1 | * | 2/2001 | Ohgami et al. | 361/679.27 |
| 6,356,459 | B1 | * | 3/2002 | DiMarco | 361/818 |

(Continued)

FOREIGN PATENT DOCUMENTS

JP 2002-372917 A 12/2002

(Continued)

OTHER PUBLICATIONS

NN87034351 Disclosure Title: Detachable Plate for Mounting Electromechanical Devices, Lock and Indicator and Bezel Assemblies.*

(Continued)

*Primary Examiner* — Prabodh M Dharia
(74) *Attorney, Agent, or Firm* — Sughrue Mion, PLLC

(57) ABSTRACT

An electromagnetic interference shielding apparatus and method for manufacturing an electromagnetic interference apparatus are provided. The apparatus includes a frame mounting a display module, a conductive rear cover mounted to a rear side of a frame, a shielding member disposed on a front side of the display module and comprising a conductive layer, a conductive member conductively connecting the shielding member with the rear cover, and a conductive adhesive member conductively connecting the conductive member with the shielding member.

31 Claims, 2 Drawing Sheets

U.S. PATENT DOCUMENTS

| | | | |
|---|---|---|---|
| 6,411,353 B1 * | 6/2002 | Yarita et al. | 349/59 |
| 6,433,492 B1 * | 8/2002 | Buonavita | 315/248 |
| 6,492,587 B1 * | 12/2002 | Yoshinaga | 174/350 |
| 6,576,832 B2 | 6/2003 | Svarfvar et al. | 174/392 |
| 6,594,150 B2 * | 7/2003 | Creason et al. | 361/727 |
| 6,604,829 B2 * | 8/2003 | Rodriguez, Jr. | 353/79 |
| 6,646,865 B2 * | 11/2003 | Huang et al. | 361/679.09 |
| 6,784,363 B2 * | 8/2004 | Jones | 174/351 |
| 6,844,684 B2 * | 1/2005 | Namiki et al. | 315/169.3 |
| 6,853,492 B1 * | 2/2005 | Lau et al. | 359/649 |
| 6,878,872 B2 * | 4/2005 | Lloyd et al. | 174/384 |
| 7,161,091 B1 * | 1/2007 | Kiishinen et al. | 174/385 |
| 7,172,435 B2 * | 2/2007 | Chen | 439/76.1 |
| 7,206,037 B2 * | 4/2007 | Nishio et al. | 349/58 |
| 7,224,313 B2 * | 5/2007 | McKinzie et al. | 343/700 MS |
| 7,225,276 B2 * | 5/2007 | Garnett et al. | 709/250 |
| 7,301,761 B2 * | 11/2007 | Merz et al. | 361/679.27 |
| 7,339,637 B2 * | 3/2008 | Chen et al. | 349/65 |
| 7,420,742 B2 * | 9/2008 | Wood et al. | 359/619 |
| 7,457,120 B2 * | 11/2008 | Bae et al. | 361/704 |
| 7,492,081 B2 * | 2/2009 | Hori et al. | 313/112 |
| 7,537,964 B2 * | 5/2009 | Minervini | 438/113 |
| 7,605,538 B2 * | 10/2009 | Park | 313/582 |
| 2001/0028953 A1 * | 10/2001 | Bluem et al. | 428/355 AC |
| 2002/0004132 A1 * | 1/2002 | Banovetz et al. | 428/343 |
| 2002/0125025 A1 * | 9/2002 | Svarfvar et al. | 174/35 R |
| 2003/0007323 A1 * | 1/2003 | Huang et al. | 361/683 |
| 2003/0062180 A1 * | 4/2003 | Jones | 174/35 GC |
| 2003/0123032 A1 * | 7/2003 | Rodriguez, Jr. | 353/74 |
| 2003/0169573 A1 * | 9/2003 | Irie et al. | 361/752 |
| 2003/0184225 A1 * | 10/2003 | Namiki et al. | 313/582 |
| 2003/0192715 A1 * | 10/2003 | Lambert et al. | 174/35 GC |
| 2004/0114062 A1 * | 6/2004 | Nishio et al. | 349/58 |
| 2004/0207940 A1 * | 10/2004 | Carter et al. | 359/879 |
| 2004/0216909 A1 * | 11/2004 | Lloyd et al. | 174/35 R |
| 2004/0246693 A1 * | 12/2004 | Lloyd et al. | 361/800 |
| 2005/0017620 A1 * | 1/2005 | Kim et al. | 313/112 |
| 2005/0024268 A1 * | 2/2005 | McKinzie et al. | 343/700 MS |
| 2005/0243106 A1 * | 11/2005 | Bae et al. | 345/679 |
| 2005/0286002 A1 * | 12/2005 | Tajima | 349/139 |
| 2006/0128179 A1 * | 6/2006 | Chen | 439/76.1 |
| 2006/0138956 A1 * | 6/2006 | Hori et al. | 313/582 |
| 2006/0279211 A1 * | 12/2006 | Park | 313/582 |
| 2006/0283630 A1 * | 12/2006 | Kiiskinen et al. | 174/377 |
| 2007/0081344 A1 * | 4/2007 | Cappaert et al. | 362/373 |
| 2007/0127129 A1 * | 6/2007 | Wood et al. | 359/619 |
| 2007/0223209 A1 * | 9/2007 | Tracewell | 361/816 |
| 2008/0078733 A1 * | 4/2008 | Nearman et al. | 211/189 |
| 2009/0087188 A1 * | 4/2009 | Anderl et al. | 398/135 |
| 2009/0251102 A1 * | 10/2009 | Hui | 320/108 |

FOREIGN PATENT DOCUMENTS

| | | |
|---|---|---|
| JP | 2005-072517 A | 3/2005 |
| KR | 1999-087746 A | 12/1999 |
| KR | 10-2004-0068662 A | 8/2004 |
| KR | 2005-101907 A | 10/2005 |

OTHER PUBLICATIONS

First Office Action dated Jun. 11, 2010, from the State Intellectual Property Office of P.R. China issued in counterpart Chinese Application No. 200610148579.1.

* cited by examiner

APPARATUS FOR SHIELDING ELECTROMAGNETIC INTERFERENCE OF DISPLAY MODULE AND A MANUFACTURING METHOD THEREOF

CROSS-REFERENCE TO RELATED APPLICATIONS

This application claims priority from Korean Patent Application No. 10-2006-0006211, filed Jan. 20, 2006, the entire contents of which are incorporated herein by reference.

BACKGROUND OF THE INVENTION

1. Field of the Invention

Apparatuses and methods consistent with the present invention relate to display modules, and more particularly, to shielding electromagnetic interference generated in a display module.

2. Description of the Related Art

A video display device outputs information as an image using a display screen. Video display devices include a monitor for a personal computer (PC), a cathode ray tube television (TV), a plasma display panel (PDP) TV, a liquid crystal display (LCD) TV, a LCD projection TV, a digital lighting processing (DLP) projection TV and so on.

The video display device comprises a display module. The display module includes a screen for displaying an image. The display module includes various kinds such as a PDP module, an LCD module and a cathode-ray tube, and the like.

The display module generates electromagnetic interference and/or wavelengths of fore infrared rays during operation. As a consequence, the display module necessitates an electromagnetic interference shielding apparatus for preventing the electromagnetic interference and/or the fore infrared ray wavelengths from leaking to the outside.

FIG. 1 illustrates an electromagnetic interference shielding apparatus for a display module according to a related art.

As shown in FIG. 1, the related art electromagnetic interference shielding apparatus comprises a frame 21 mounting a display module 20, a rear cover 23 mounted on a rear side of the frame 21, a shielding member 22 disposed on a front of the display module 20, a first pressing bracket 24 compressing a front edge of the shielding member 22, a conductive gasket 25 interposed between the first pressing bracket 24 and the shielding member 22, and a second pressing bracket 26 fastened to the first pressing bracket 24 to compress a rear edge of the display module 20.

The frame 21 comprises a plurality of fastening bosses 21a and 21b on an inner surface of a front thereof. The first pressing bracket 24 is fastened to the respective fastening bosses 21a and 21b through first and second conductive fastening members 28 and 29.

The rear cover 23 is made of conductive material. The rear cover 23 and the first pressing bracket 24 are conductively coupled by being fastened through a third conductive fastening member 27.

A conductive part 22a is formed at the front edge of the shielding member 22. The conductive gasket 25 is interposed between the conductive part 22a and the first pressing bracket 24.

The first pressing bracket 24 compresses and supports the conductive part 22a of the shielding member 22 so that the shielding member 22 and the first pressing bracket 24 become conductive.

The second pressing bracket 26 is fastened to the fastening boss 21a of the frame 21, through the first conductive fastening member 28 together with the first pressing bracket 24 and compresses a rear edge of the display module 20, thereby ensuring conductivity of the conductive part 22a of the shielding member 22 and the first pressing bracket 24.

Through this structure, electromagnetic interference being radiated to the front side of the display module 20 is shielded by the shielding member 22, and electromagnetic interference radiated to lateral sides and/or the rear side is shielded by the first pressing bracket 24 and the rear cover 23.

According to the related art, conductivity of the first bracket 24 and the shielding member 22 is partially ensured by the second pressing bracket 26 compressing the rear edge of the display module 20. However, shielding efficiency of the related art is not satisfactory because of incomplete airtightness between the first pressing bracket 24 and the shielding member 22.

Furthermore, in the related art, a compressing force of the first and the second pressing brackets 24 and 26 may be transmitted to the display module 20, thereby causing serious damage to the display module 20.

In addition, since lateral and rear sides of the display module 20 of the related art, comprising the first and the second pressing brackets 24 and 26 and the rear cover 23, have a complicated structure, a number of parts are required, such as the plurality of conductive fastening members 27, 28 and 29, the fastening bosses 21a and 21b, and the conductive gasket 25. Accordingly, the assembling structure and the manufacturing processes becomes complicated, thereby increasing the manufacturing cost.

In the related art shielding apparatus, moreover, respective four first and second pressing brackets 24 and 26 and four conductive gaskets 25 (one set for each corner of the display), that is, a total of 12 component parts, are necessary for assembling one video display device. These parts increase the entire weight of the video displaying device.

Such complicated conductive structure also increases a thickness of the video displaying device.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides an electromagnetic interference shielding apparatus for a display module, capable of considerably improving efficiency of shielding electromagnetic interference, and/or of radiating heat, and a method for manufacturing the same.

The present invention also provides an electromagnetic interference shielding apparatus for a display module, wherein mechanical load and stress are not focused on the display module, and a method for manufacturing the same.

The present invention also provides an electromagnetic interference shielding apparatus for a display module, capable of considerably reducing manufacturing cost by reducing the number of parts required, and a method for manufacturing the same.

The present invention also provides an electromagnetic interference shielding apparatus for a display module, capable of implementing a low-profiled video display device, and a method for manufacturing the same.

According to an aspect of the present invention, there is provided an electromagnetic interference shielding apparatus comprising a conductive rear cover mounted to a rear side of a frame; a shielding member which shields electromagnetic interference; conductive coupling means for conductively coupling the shielding member with the conductive rear cover through a conductive means; and a conductive adhesive means for conductively adhering the conductive means to the shielding member.

The conductive means may comprise a conductive member conductively coupled to the conductive rear cover.

The conductive member may comprise at least one of aluminum, copper, nickel, carbon, black lead, aluminum alloy, copper alloy, and nickel alloy.

A contacting area between the conductive member and the rear cover may be fastened to the frame by at least one conductive fastening member.

The conductive means may comprise a supporting member mounted to the frame to the rear cover, and the supporting member may be coated with a conductive layer for conductively coupling the rear cover and the shielding member.

The supporting member may be non-conductive.

The supporting member may be formed of non-conductive resin.

The conductive layer may comprise at least one of aluminum, copper, nickel, carbon, black lead, aluminum alloy, copper alloy, and nickel alloy.

A contacting area between the conductive layer of the support member and the rear cover may be fastened with the frame by at least one conductive fastening means.

The frame may comprise a mounting surface for mounting the shielding member and the rear cover on an inner surface thereof, and the conductive means may comprise a conductive layer coating the mounting surface.

The mounting surface may be non-conductive.

The shielding member may be adhered to a side end of the conductive layer by the conductive adhesive means, and a slant part end of the rear cover may be connected to an other side end of the conductive layer by the fastening member.

The conductive adhesive means may comprise a conductive dual-coated tape.

The conductive adhesive means may comprise a conductive liquid adhesive.

The conductive liquid adhesive may comprise at least one of aluminum powder, nickel powder, and copper powder.

According to another aspect of the present invention, there is provided

BRIEF DESCRIPTION OF THE DRAWING FIGURES

The above and other aspects of the present invention will become more apparent by describing in detail exemplary embodiments thereof with reference to the attached drawing figures, wherein.

DETAILED DESCRIPTION OF THE EXEMPLARY EMBODIMENTS

Figure 1:
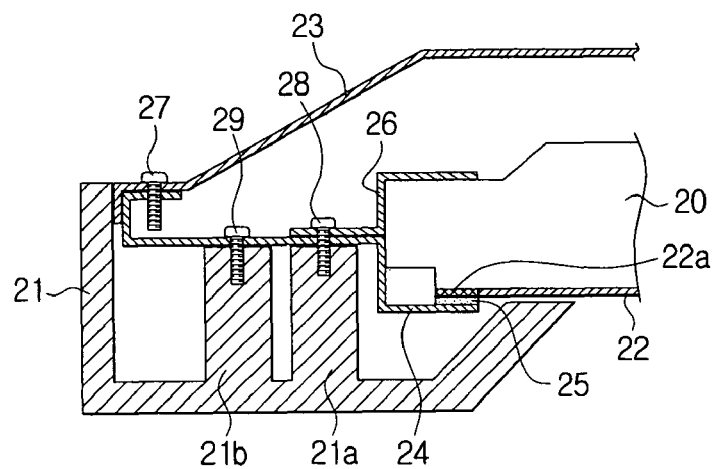
FIG. 1 is a sectional view of a related art electromagnetic interference shielding apparatus for a display module.

Hereinafter, certain exemplary embodiments of the present invention will be described in detail with reference to the accompanying drawing figures.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

In the following description, the term"conduct", "conductive", or "conductivity" refers to the transmission of heat and/or electricity.

Figure 2:
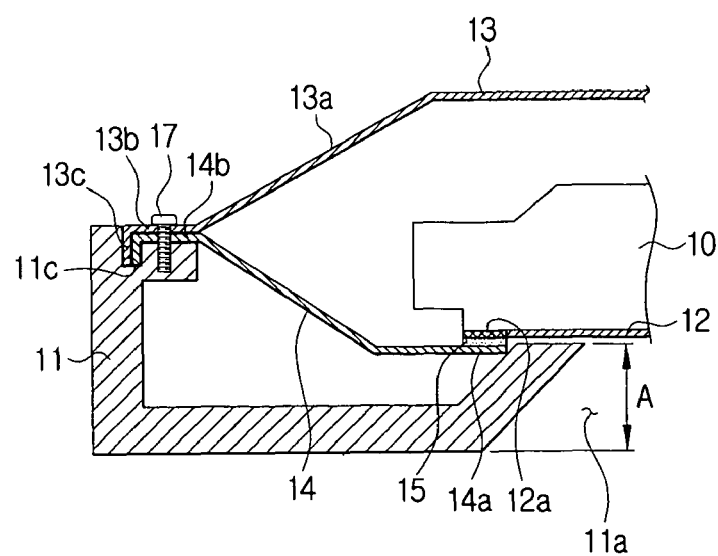
FIG. 2 is a sectional view of an electromagnetic interference shielding apparatus for a display module according to a first exemplary embodiment of the present invention.

FIG. 2 shows an electromagnetic interference shielding apparatus according to a first exemplary embodiment of the present invention. The electromagnetic interference shielding apparatus comprises a display module 10 mounted to a frame 11 by a bracket (not shown).

A front side of the frame 11 is opened as a screen display part 11a for exposing a front side of the display module 10 therethrough.

A conductive rear cover 13 is disposed at a rear side of the display module 10. An edge of the conductive rear cover 13 has a slant part 13a slanting by at an angle. The angle may be predetermined. An end 13b of the slant part 13a is fastened to the frame 11. A fitting hook 13c is formed at the end 13b and inserted in a mounting recess 11c of the frame 11.

A shielding member 12 is attached to the front side of the display module 10. The shielding member 12 has a conductive layer (not shown) for shielding the electromagnetic interference radiated from the front side of the display module 10. The shielding member 12 may further include functions of preventing diffused reflection and compensating color.

The shielding member 12 comprises a conductive edge part 12a conductively connected the conductive layer of the shielding member 12.

The shielding member 12 is conductively connected with the rear cover 13 through a conductive member 14. The conductive member 14 may comprise various conductive materials such as aluminum, copper, nickel, carbon, black lead, aluminum alloy, copper alloy, and nickel alloy, or other like conductive material.

The shielding member 12 and the conductive member 14 are conductively coupled through a conductive adhesive member 15 which is interposed between the conductive edge part 12a of the shielding member 12 and one end of the conductive member 14.

According to an exemplary embodiment of the present invention as described above, the conductive edge part 12a of the shielding member 12 is tightly adhered to the one end of the conductive member 14 by the conductive adhesive member 15. Accordingly, an actual contacting area between the shielding member 12 and the conductive member 14 is increased, thereby highly improving the conductivity.

A conductive dual-coated tape may be used for the conductive adhesive member 15. A conductive liquid adhesive containing conductive materials such as aluminum powder, nickel powder, copper powder, or other similar substance is also applicable.

Since the conductive member 14 of the first exemplary embodiment is configured to be conductively coupled upon being adhered through the conductive adhesive member 15, less supporting strength is needed in comparison with a related art compressing/fastening structure. Therefore, a thickness of the conductive member 14 can be reduced to approximately 0.3 mm ~ approximately 0.6 mm and accordingly, thickness A of a front edge of the frame 11 can be considerably reduced. This finally reduces the whole thickness of the video display device.

As shown in FIG. 2, the conductive member 14 has a bent form for partly surrounding a lateral side of the display module 10. The slant part 13a of the rear cover 13 surrounds the rest part of the lateral side of the display module 10.

One side end 14a of the conductive member 14 is conductively coupled to the conductive edge 12a of the shielding member 12 through the conductive adhesive member 15, and an other side end 14b of the conductive member 14 to the end 13b of the rear cover 13.

The other side end 14b of the conductive member 14 is fastened to the frame 11 through the conductive fastening member 17, together with the end 13b of the rear cover 13, thereby conductively connecting the shielding member 12 and the rear cover 13.

As described above, the front side of the display module 10 is shielded by the shielding member 12. The lateral and the rear sides are shielded by the rear cover 13 and the conductive member 14. Therefore, electromagnetic interference can be shielded almost perfectly.

Figure 3:
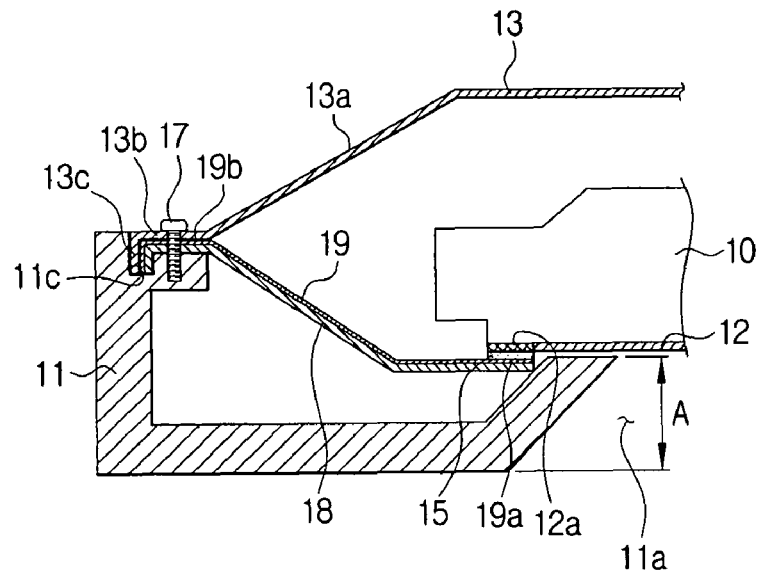
FIG. 3 is a sectional view of an electromagnetic interference shielding apparatus for a display module according to a second exemplary embodiment of the present invention.

FIG. 3 shows an electromagnetic interference shielding apparatus for a display module, according to a second exemplary embodiment of the present invention.

This exemplary embodiment includes a support member 18 made of non-conductive material such as synthetic resin or other such material. The supporting member 18 comprises a conductive layer 19 coated on a surface thereof. The shielding member 12 is adhered to a side end 19a of the conductive layer 19. The end 13b of the rear cover 13 is connected to an other side end 19b through a fastening member 17. Thus, by the conductive layer 19, the rear cover 13 and the shielding member 12 are conductively coupled with each other.

Similar to the conductive member 14 of the first exemplary embodiment described above, the conductive layer 19 may comprise various conductive materials such as aluminum, copper, nickel, carbon, black lead, aluminum alloy, copper alloy, and nickel alloy, or other like conductive material.

The other structures of the second exemplary embodiment will not be described in detail since being the same as those of the first exemplary embodiment.

Figure 4:
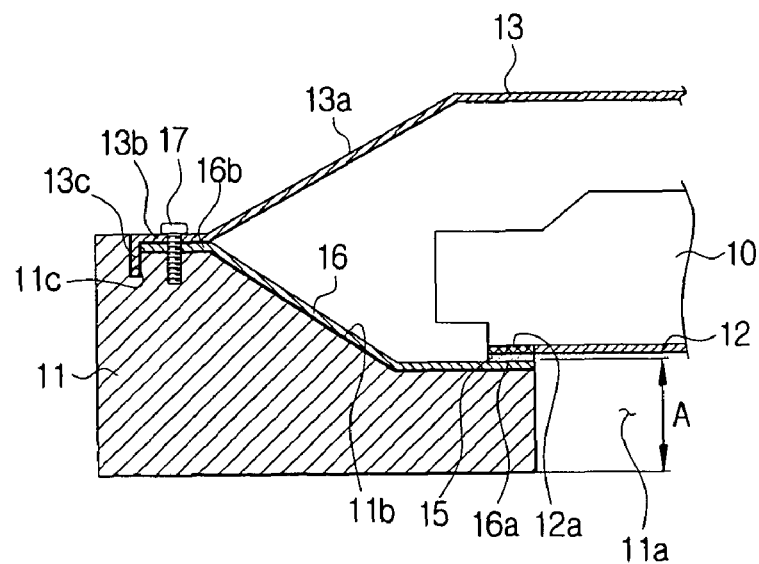
FIG. 4 is a sectional view of an electromagnetic interference shielding apparatus for a display module according to a third exemplary embodiment of the present invention.

FIG. 4 shows an electromagnetic interference shielding apparatus for a display module, according to a third exemplary embodiment of the present invention.

The third embodiment comprises a mounting surface 11b for mounting a shielding member 12 and a rear cover 13. The mounting surface 11b is coated with a conductive layer 16.

The shielding member 12 is adhered to a side end 16a of the conductive layer 16 by a conductive adhesive member 15. An end 13b of the rear cover 13 is connected to an other side end 16b of through a fastening member 17. Thus, the rear cover 13 and the shielding member 12 are conductively coupled by the conductive layer 16.

Similar to the conductive member 14 of the first exemplary embodiment, the conductive layer 16 may comprise various conductive materials such as aluminum, copper, nickel, carbon, black lead, aluminum alloy, copper alloy, and nickel alloy, or other like conductive material.

The other structures of the third exemplary embodiment will not be repeated because they are the same as in the above-described exemplary embodiments.

The shielding member 12 in the exemplary embodiments of the present invention may be implemented in the forms of a shielding film attached to the front side of the display module 10 and an optical filter mounted at a certain distance from the display module 10, for example, through various types of shielding means comprising functions of electromagnetic interference shielding, diffused reflection prevention, and color compensation.

In contrast to the related art, exemplary embodiments of the present invention do not demand fixing brackets for fixing and fastening a shielding member 12 but support the shielding member 12 using a conductive member 14, a support member 18 coated with the conductive layer 19 or a conductive layer 16 coating an inner surface of a frame 11. As a result, the thickness of the frame 11 can be significantly reduced, thereby realizing a lower-profiled video display device.

In addition, according to exemplary embodiments of the present invention, the contacting area between a shielding member 12 and the conductive member 14 or the conductive layers 16 and 19 can be increased by using a conductive adhesive means 15. Consequently, shielding efficiency can be improved. Simultaneously, the reduced number of parts enables saving of the manufacturing cost.

Since a shielding member 12 is supported to a frame 11 through a conductive adhesive means 15, mechanical load or focused stress is not directly transmitted to a display module 10, thereby preventing damage to the display module 10.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An electromagnetic interference shielding apparatus comprising:
   a frame configured to mount a display module;
   a conductive rear cover which is mounted to a rear side of a frame;
   a shielding member which is disposed on a front side of the display module and shields electromagnetic interference, wherein the shielding member has a front side and a rear side and the rear side of the shielding member faces the front side of the display module;
   conductive coupling means for conductively coupling the shielding member with the conductive rear cover, wherein the conductive coupling means including a first end and a second end; and
   a conductive adhesive means for conductively adhering the conductive means to the shielding member;
   wherein the first end of the conductive coupling means is coupled with the front side of the shielding member through the conductive adhesive means so as to be substantially parallel to the front side of the shielding member,
   wherein the conductive coupling means includes a bent part extending from the first end to the second end of the coupling means with an obtuse angle formed between the bent part and the first end and partly surrounding a lateral side of the display module, and the conductive rear cover includes a slant part surrounding the rest part of the lateral side of the display module.

2. The shielding apparatus of claim 1, wherein the conductive coupling means comprises a conductive member which is conductively coupled to the conductive rear cover.

3. The shielding apparatus of claim 2, wherein the conductive member comprises at least one of aluminum, copper, nickel, carbon, black lead, aluminum alloy, copper alloy, and nickel alloy.

4. The shielding apparatus of claim 2, wherein a contacting area between the conductive member and the conductive rear cover is conductively fastened to the frame by at least one conductive fastening member.

5. The shielding apparatus of claim 1, wherein the conductive coupling means comprises a supporting member mounted to the frame and the conductive rear cover, and the supporting member is coated with a conductive layer for conductively coupling the conductive rear cover and the shielding member.

6. The shielding apparatus of claim 5, wherein the supporting member is non-conductive.

7. The shielding apparatus of claim 5, wherein the supporting member is formed of non-conductive resin.

8. The shielding apparatus of claim 5, wherein the conductive layer comprises at least one of aluminum, copper, nickel, carbon, black lead, aluminum alloy, copper alloy, and nickel alloy.

9. The shielding apparatus of claim 5, wherein a contacting area between the conductive layer of the support member and the conductive rear cover is conductively fastened to the frame by at least one conductive fastening member.

10. The shielding apparatus of claim 1, wherein the frame comprises a mounting surface for mounting the shielding member and the conductive rear cover on an inner surface thereof, and the conductive means comprises a conductive layer coating the mounting surface.

11. The shielding apparatus of claim 10, wherein the mounting surface is non-conductive.

12. The shielding apparatus of claim 10, wherein the shielding member is adhered to a side end of the conductive layer by the conductive adhesive means, and a slant part end of the conductive rear cover is coupled to another side end of the conductive layer by a fastening member.

13. The shielding apparatus of claim 1, wherein the conductive adhesive means comprises a conductive dual-coated tape.

14. The shielding apparatus of claim 1, wherein the conductive adhesive means comprises a conductive liquid adhesive.

15. The shielding apparatus of claim 14, wherein the conductive liquid adhesive comprises at least one of aluminum powder, nickel powder, and copper powder.

16. The shielding apparatus of claim 1, wherein both the conductive rear cover and the conductive coupling means are in contact with the frame.

17. A method for manufacturing an electromagnetic interference shielding apparatus that comprises a frame mounting a display module, a shielding member disposed on a front side of the display module, and a conductive rear cover, the shielding member having a front side and a rear side facing the front side of the display module, the method comprising:

conductively connecting the conductive rear cover with the shielding member through a conductive means including a first end and a second end; and conductively coupling the shielding member and the conductive means through a conductive adhesive means;

wherein the first end of the conductive means is coupled with the front side of the shielding member through the conductive adhesive means so as to be substantially parallel to the front side of the shielding member, wherein the conductive means includes a bent part extending from the first end to the second end of the conductive means with an obtuse angle formed between the bent part and the first end and partly surrounding a lateral side of the display module, and the conductive rear cover includes a slant part surrounding the rest part of the lateral side of the display module.

18. The method of claim 17, wherein the conductive means comprises a conductive member which is conductively coupled to the conductive rear cover.

19. The method of claim 18, wherein the conductive member comprises at least one of aluminum, copper, nickel, carbon, black lead, aluminum alloy, copper alloy, and nickel alloy.

20. The method of claim 18, wherein a contacting area between the conductive member and the conductive rear cover is conductively fastened to the frame by at least one conductive fastening member.

21. The method of claim 17, wherein the conductive means comprises a supporting member mounted to the frame and the conductive rear cover, and the supporting member is coated with a conductive layer for conductively coupling the conductive rear cover and the shielding member.

22. The method of claim 21, wherein the supporting member is non-conductive.

23. The method of claim 21, wherein the supporting member is formed of non-conductive resin.

24. The method of claim 21, wherein the conductive layer comprises at least one of aluminum, copper, nickel, carbon, black lead, aluminum alloy, copper alloy, and nickel alloy.

25. The method of claim 21, wherein a contacting area between the conductive layer of the support member and the conductive rear cover is conductively fastened to the frame by at least one conductive fastening member.

26. The method of claim 17, wherein the frame comprises a mounting surface for mounting the shielding member and the conductive rear cover on an inner surface thereof, and the conductive means comprises a conductive layer coating the mounting surface.

27. The shielding apparatus of claim 26, wherein the mounting surface is non-conductive.

28. The method of claim 26, wherein the shielding member is adhered to a side end of the conductive layer by the conductive adhesive means, and a slant part end of the conductive rear cover is coupled to an other side end of the conductive layer by a fastening member.

29. The method of claim 17, wherein the conductive adhesive means comprises a conductive dual-coated tape.

30. The method of claim 17, wherein the conductive adhesive means comprises a conductive liquid adhesive.

31. The method of claim 30, wherein the conductive liquid adhesive comprises at least one of aluminum powder, nickel powder, and copper powder.

* * * * *